United States Patent [19]

Ovens et al.

[11] Patent Number: 4,754,172

[45] Date of Patent: Jun. 28, 1988

[54] STL LOW IMPEDANCE BUFFER/DRIVER

[75] Inventors: Kevin M. Ovens; Bobby D. Strong, both of Garland, Tex.

[73] Assignee: Texas Instruments Incorporated, Dallas, Tex.

[21] Appl. No.: 942,311

[22] Filed: Dec. 16, 1986

[51] Int. Cl.$^4$ .......................................... H03K 19/084
[52] U.S. Cl. ................................... 307/454; 307/458; 307/270; 357/15
[58] Field of Search ................ 307/443, 454, 456–458, 307/270; 357/15, 71, 67, 92

[56] References Cited

U.S. PATENT DOCUMENTS

| | | | |
|---|---|---|---|
| 3,867,644 | 2/1975 | Cline | 307/456 |
| 4,035,664 | 7/1977 | Berger et al. | 357/92 X |
| 4,562,364 | 12/1985 | Tanizawa | 307/443 X |
| 4,607,175 | 8/1986 | Lee et al. | 307/443 |

OTHER PUBLICATIONS

Dansky et al., "Voltage Booster", *IBM T.D.B.*, vol. 26, No. 7B, Dec. 1983, pp. 3618–3619.

*Primary Examiner*—Stanley D. Miller
*Assistant Examiner*—D. R. Hudspeth
*Attorney, Agent, or Firm*—Thomas R. FitzGerald; Leo N. Heiting; Melvin Sharp

[57] ABSTRACT

The disclosure relates to an STL bipolar buffer/driver circuit having a low output impedance for driving capacitive leads and the like wherein the output resistor of the prior art circuits is replaced by an NPN bipolar transistor and a further circuit including a series resistor, schottky diode and schottky clamp transistor for controlling the two output transistors.

10 Claims, 1 Drawing Sheet

STL LOW IMPEDANCE BUFFER/DRIVER

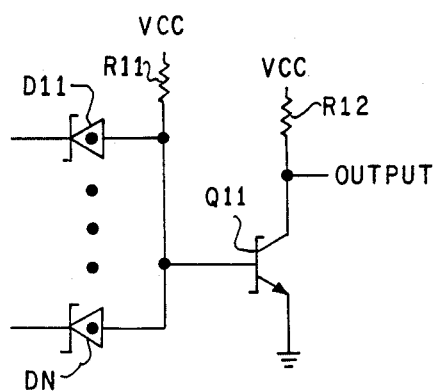
Fig. 1 PRIOR ART
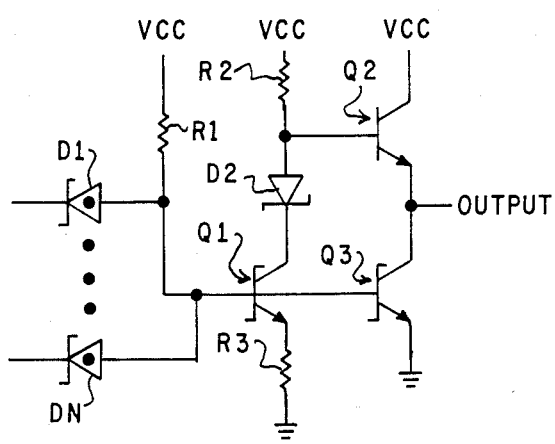
Fig. 2 STL LOW IMPEDANCE BUFFER/DRIVER

STL LOW IMPEDANCE BUFFER/DRIVER

BACKGROUND OF THE INVENTION

1. Field of the Invention

This invention relates to shottky transistor logic (STL) circuits and, more specifically, to such a circuit which has low output impedance.

2. Brief Description of the Prior Art

STL is relatively high impedance bipolar very large scale integration (VLSI) logic which operates from a two volt source. These types of circuits are finding increased use relative to logic circuts requiring higher voltage supplies, such as about five volts, due to the substantial decrease in power requirement, thereby increasing the number of components that can be placed on the chip without excess heating problems. Such STL circuits of the prior art utilize a resistor to drive the output therefrom (a transistor pulling the output low and a resistor pulling the output high). These prior art STL circuits are often required to drive long metal traces as parts of integrated circuits, which traces can have substantial capacitance and also are often required to overcome titanium tungsten (TiW) diode leakage on STL integrated circuits. It is apparent that such STL circuit arrangements inherently provide a high output impedance from the logic circuit to an external load due to the use of the resistor to drive the output. Therefore, if there is a high fan out (load on the output) or if there is a high capacitance on the output, the resistor will have great difficulty in pulling the output of the logic circuit high when a high logic level is to be provided. In addition, low output impedances are desirable in order to provide increased circuit operating speed. It is therefore readily apparent the STL circuits which are capable of operation with low output impedance will provide desirable characteristics as compared with prior art STL circuits.

SUMMARY OF THE INVENTION

In accordance with the present invention, the above noted problems of the prior art are minimized and there is provided an STL circuit having substantially the same function as that of the prior art and which also has relatively low output impedance, higher operating speed and lower power consumption. This STL circuit utilizes the fact that the voltage drops across different types of schottky diodes and transistors are different and can be utilized in circuit design to provide desirable results not available using prior art circuit design techniques. For example, the voltage drop across a titanium tungsten schottky diode is about 0.3 volts whereas the voltage drop across a platinum silicide schottky diode is about 0.6 volts. The voltage drop between base and emitter of an "on" schottky clamp transistor is about 0.8 volts whereas it is about 0.6 volts or less when the transistor is "off". The voltage drop between collector and emitter of the schottky clamp transistor is about 0.2 volts when the transistor is "on" and open when the transistor is "off". Other schottky elements not discussed herein can also be used in place of those discussed herein. It is merely necessary that the elements used have different voltage drops thereacross in the same manner as in the case of those elements discussed herein.

Briefly, in accordance with the present invention, an NPN bipolar emitter follower having a base to emitter voltage drop of about 0.8 volts is used as a low impedance driver at the output of the STL circuit to pull the output of the logic circuit high. The high output level driver is separated from the low output level driver so that the NPN bipolar transistor drives the output high and a first schottky clamp transistor drives the output low. An additional schottky clamp transistor and platinum silicide diode-resistor voltage divider is utilized to provide the base drive and control for the NPN bipolar transistor. The additional transistor and diode reduce the voltage swing on the NPN bipolar transistor base, thereby improving the operating speed thereof. A resistor is also placed in the emitter circuit of the additional transistor to discharge or pull down the output node quickly by limiting the base drive to the additional transistor, thereby directing more base current into the base of the low output level first transistor driver.

BRIEF DESCRIPTION OF THE DRAWINGS

FIG. 1 is a circuit diagram of an STL NAND circuit in accordance with the prior art, and FIG. 2 is a circuit diagram of an STL low impedance buffer/driver shown as a NAND gate in accordance with the present invention.

DESCRIPTION OF THE PREFERRED EMBODIMENT

Referring first to FIG. 1, there is shown an STL circuit in the form of a NAND gate in accordance with the prior art. The circuit includes a plurality of titanium tungsten schottky diodes D11 to DN with their cathodes as the inputs and their anodes connected in common to the base of a schottky clamp transistor Q11 and to Vcc through a resistor R11. The emitter of the transistor Q11 is connected to ground and the collector thereof acts as the output and is connected to Vcc through a resistor R12. The resistor R12 normally has a value of from about 8K to about 40K ohms. This relatively high output impedance makes it difficult to have the output high when the load circuit is highly capacitive. It is therefore necessary that the output impedance be materially lowered in order to provide reliable logic levels at the output of the STL circuit.

In accordance with the present invention, as is shown in FIG. 2, the resistor R12 of the prior art is replaced by the resistor R2, the platinum silicide schottky diode D2, the schottky clamp transistor Q1, the resistor R3 and the NPN transistor Q2. The schottky clamp transistor Q3 is the equivalent of transistor Q11 of the prior art and titanium tungsten diodes D1 and Dn and resistor R1 are the same as prior art diodes D11 to DN and resistor R11. The circuit elements interposed between the diodes D1 to DN and the transistor Q3, are the further schottky clamp transistor Q1, the base of which is coupled to the anodes of the diodes D1 to DN along with the base of transistor Q3. The emitter of transistor Q1 is coupled through a resistor R3 to ground, the collector thereof being coupled to Vcc through a platinum silicide schottky diode D2 in series with a resistor R2. Resistor R3 is required to limit the amount of drive into the base of transistor Q1 whereby the use of resistor R3 distributes the power between transistors Q1 and Q3. The base of transistors Q2 is coupled to the junction of resistor R2 and diode D2 with the collector of transistor Q2 being coupled to Vcc. The advantage of this circuit over that of the prior art is an increase in operating speed at higher loading (primarily capacitive loading)

with the tradeoff being the need for extra components and therefore use of increased chip area.

In operation with reference to FIG. 2, assuming one or more of the input diodes D1 to DN goes from a high voltage to a low voltage, current will conduct through resistor R1 and through the diodes that are low. This will drop the voltage on the base of transistors Q1 and Q3 and turn them off. With transistor Q3 off, the collector thereof, which is the output of the circuit, will show a high voltage. This output will rise quickly because transistor Q1 is also off, causing resistor R2 to charge all of its stray capacitances and pull up the voltage on the base of transistor Q2. The rise of the voltage on the base of transistor Q2 turns on that transistor and also causes the current into that base to be beta amplified into the output of the gate circuit to pull the output voltage up rapidly.

When all of the outputs on the cathodes of diodes D1 to DN go from a low voltage to a high voltage (the diodes are reverse biased), resistor R1 conducts into the bases of transistors Q1 and Q3, causing these transistors to turn on. Transistor Q3 turns on harder or conducts more current than transistor Q1 because due to resistor R3 which decreases the base to emitter voltage across transistor Q1 compared to transistor Q3. Therefore, the voltage on the collectors of both transistors Q1 and Q3 will start to fall with the collector of transistor Q3 falling faster than the collector of transistor Q1 due to the sizing of transistor R3. This allows transistor Q2 to shut off quickly. It can be seen that with transistor Q3 being on, the output of the circuit will be pulled to a low voltage.

By providing the novel circuit arrangement of FIG. 2 as compared with the prior art, the output impedance is decreased by a factor of beta which is in the range of about 100, thereby causing the output impedance for the embodiment of FIG. 2 to be about 200 ohms. As stated, this provides a reduction in output impedance by a factor of about 100, provides an increase in operating speed of the circuit and results in lower power drain as compared with the prior art STL circuits for performing the same function.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications

We claim:

1. A circuit which comprises, in combination:
   (a) logic input means,
   (b) a voltage supply source,
   (c) a reference voltage source,
   (d) output means coupled across said supply source and said reference voltage source including a bipolar transistor having electron emitting, electron collecting and control electrodes and a schottky transistor having electron emitting, electron collecting and control electrodes, the electron collecting electrode of said bipolar transistor being coupled to said supply source and the electron emitting electrode of said bipolar transistor being coupled to the electron collecting electrode of said schottky transistor, the electron emitting electrode of said schottky transistor being coupled to said reference voltage source, and an output terminal coupled to the electron emitting electrode of said bipolar transistor, said input means being coupled to the control electrode of said schottky transistor, and
   (e) and a drive circuit responsive to said input means and coupled to the control electrode of said bipolar transistor for driving said bipolar transistor, said drive circuit including a second schottky transistor having electron emitting, electron collecting and control electrodes, the control electrode thereof being coupled to said input means and a schottky diode coupled between the electron collecting electrode of said second shottky diode and said control electrode of said bipolar transistor.

2. A circuit as set forth in claim 1 wherein said input means includes an AND circuit.

3. A circuit which comprises, in combination:
   (a) input means,
   (b) a voltage supply source,
   (c) a reference voltage source,
   (d) output means coupled across said supply source and said reference voltage source including a bipolar transistor and a first schottky transistor having a control electrode, an electron emitting electrode and an electron collecting electrode, said bipolar transistor having an electron collecting electrode coupled to said supply source and an electron emitting electrode coupled to the electron collecting electrode of said first schottky transistor being coupled to said reference voltage source, and an output terminal coupled to the electron emitting electrode of said bipolar transistor, said input means being coupled to the control electrode of said first schottky transistor, wherein said input means includes a series connected circuit comprising a second schottky transistor having an electron emitting electrode, an electron collecting electrode and a control electrode, a schottky diode having one electrode thereof coupled to the electron collecting electrode of said second schottky transistor, first resistance means coupled to said supply source and to the other electrode of said schottky diode and second resistance means coupled to said reference voltage source and to the electron emitting electrode of said second schottky transistor, the control electrode of said bipolar transistor being coupled to the junction of said diode and said first resistance means.

4. A circuit as set forth in claim 3 wherein the control electrodes of said first and second schottky transistors are connected together.

5. A circuit as set forth in claim 2 wherein said input means includes an AND circuit.

6. A circuit as set forth in claim 4 wherein said input means includes an AND circuit.

7. An STL circuit which includes, in combination:
   (a) input means for providing an input signal, said input means including a schottky diode serially connected to a second schottky transistor, said input signal driving said second schottky diode,
   (b) a voltage supply source,
   (c) a reference voltage source, and
   (d) output means coupled across said supply source and said reference voltage source including a low impedance bipolar transistor and a first schottky transistor serially connected thereto, and an output terminal coupled to the junctions of said bipolar transistor and said first schottky transistor, said input signal controlling said first schottky transistor and said schottky diode driving said bipolar transistor.

8. The circuit of claim 7 further including voltage swing reduction means coupled to the control electrode of said bipolar transistor to reduce the voltage swing thereof.

9. An STL circuit which includes, in combination:
(a) input means for receiving an input signal,
(b) a voltage supply source,
(c) a reference voltage source, and
(d) output means coupled across said supply source and said reference voltage source including a low impedance bipolar transistor and a first schottky transistor serially connected thereto having an electron emitting electrode, an electron collecting electrode and a control electrode, and an output terminal coupled to the junctions of said bipolar transistor and said first schottky transistor, said input signal controlling said first schottky transistor, wherein said voltage swing reduction means includes a series connected circuit comprising a second schottky transistor having an electron emitting electrode, an electron collecting electrode and a control electrode, a schottky diode having one electrode thereof coupled to the electron collecting electrode of said second schottky transistor, first resistance means coupled to said supply source and to the other electrode of said schottky diode and second resistance means coupled to said reference voltage source and to the electron emitting electrode of said second schottky transistor, the control electrode of said bipolar transistor being coupled to the junction of said diode and said first resistance means.

10. The circuit of claim 9 further including voltage swing reduction means coupled to the control electrode of said bipolar transistor to reduce the voltage swing thereof.

* * * * *